(12) United States Patent
Karpov et al.

(10) Patent No.: US 8,187,946 B2
(45) Date of Patent: May 29, 2012

(54) MANUFACTURING A PHASE CHANGE MEMORY DEVICE HAVING A RING HEATER

(75) Inventors: Ilya V. Karpov, Santa Clara, CA (US); Sergey Kostylev, Bloomfield Hills, MI (US); Charles C. Kuo, Union City, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 2 days.

(21) Appl. No.: 12/958,175

(22) Filed: Dec. 1, 2010

(65) Prior Publication Data

US 2011/0070715 A1 Mar. 24, 2011

Related U.S. Application Data

(62) Division of application No. 11/531,800, filed on Sep. 14, 2006, now Pat. No. 7,863,596.

(30) Foreign Application Priority Data

Sep. 14, 2005 (EP) ..................................... 05108413

(51) Int. Cl.
*H01L 21/20* (2006.01)

(52) U.S. Cl. ..................... 438/382; 257/3; 257/E31.029

(58) Field of Classification Search ....................... 257/3
See application file for complete search history.

(56) References Cited

U.S. PATENT DOCUMENTS

| 7,135,696 | B2 | 11/2006 | Karpov et al. |
| 2003/0164515 | A1 | 9/2003 | Xu |
| 2004/0012009 | A1* | 1/2004 | Casagrande et al. ............. 257/4 |
| 2005/0121659 | A1 | 6/2005 | Tanaka et al. |
| 2005/0127348 | A1 | 6/2005 | Horak et al. |
| 2005/0139816 | A1 | 6/2005 | Jeong et al. |
| 2005/0167656 | A1 | 8/2005 | Sun et al. |
| 2006/0091492 | A1* | 5/2006 | Lee et al. ....................... 257/467 |
| 2006/0208847 | A1 | 9/2006 | Lankhorst et al. |
| 2008/0012094 | A1 | 1/2008 | Ma et al. |

FOREIGN PATENT DOCUMENTS

EP 1 339 110 A9 8/2003

* cited by examiner

*Primary Examiner* — Tony Tran
(74) *Attorney, Agent, or Firm* — Seed IP Law Group PLLC

(57) ABSTRACT

A ring shaped heater surrounds a chalcogenide region along the length of a cylindrical solid phase portion thereof defining a change phase memory element. The chalcogenide region is formed in a sub-lithographic pore, so that a relatively compact structure is achieved. Furthermore, the ring contact between the heater and the cylindrical solid phase portion results in a more gradual transition of resistance versus programming current, enabling multilevel memories to be formed.

12 Claims, 5 Drawing Sheets

MANUFACTURING A PHASE CHANGE MEMORY DEVICE HAVING A RING HEATER

BACKGROUND OF THE INVENTION

1. Field of the Invention

Figure 1:
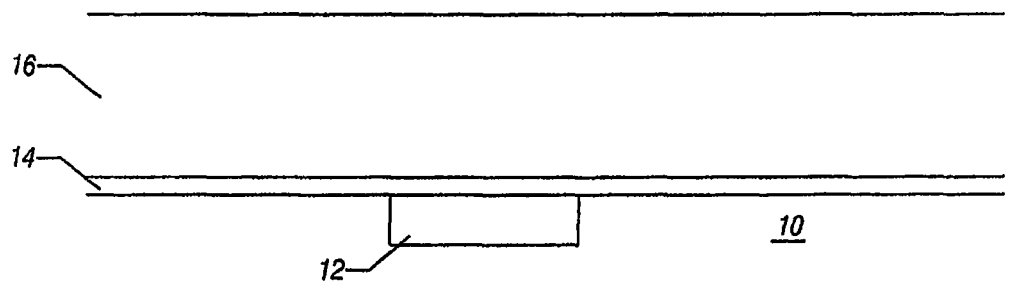

The present invention relates generally to multilevel phase change memory, and in particular to a ring heater for a phase change memory device.

2. Description of the Related Art

Phase change memory devices use phase change materials, i.e., materials that may be electrically switched between a generally amorphous and a generally crystalline state, for electronic memory application. One type of memory element utilizes a phase change material that may be electrically switched between a structural state of generally amorphous local order and a structural state of generally crystalline local order or among different detectable states of local order across the entire spectrum between completely amorphous and completely crystalline order. The state of the phase change materials is also non-volatile in that, when set in either a crystalline, semi-crystalline, amorphous, or semi-amorphous state representing a resistance value, that phase or physical state and the resistance value associated thereto are retained until changed by another programming event. The state is unaffected by removing electrical power.

A multilevel phase change memory is capable of being programmed to more than the two conventional states, termed set and reset. In order to form the multilevel memory, it is desirable to provide a cell which is capable of being gradually programmed so that more than two programmable states can be provided. This generally means that the plot of resistance versus current for the cell should have a gradual slope.

BRIEF SUMMARY OF THE INVENTION

On embodiment of the invention provides a phase change memory and the manufacturing process thereof that allows multilevel programming. One embodiment of the present invention is a method of manufacturing a phase change memory device comprising the steps of forming a phase change region and surrounding the phase change region with a heater.

One embodiment of the invention is a phase change memory comprising a sub-lithographic pore, a chalcogenide region in said pore, and a heater surrounding the chalcogenide region.

One embodiment of the invention is a system comprising a controller, a static random access memory connected to said controller, and a phase change memory. The phase change memory includes a sub-lithographic pore, a chalcogenide region in said pore, and a heater surrounding said chalcogenide region.

BRIEF DESCRIPTION OF THE SEVERAL VIEWS OF THE DRAWING(S)

Figure 10:
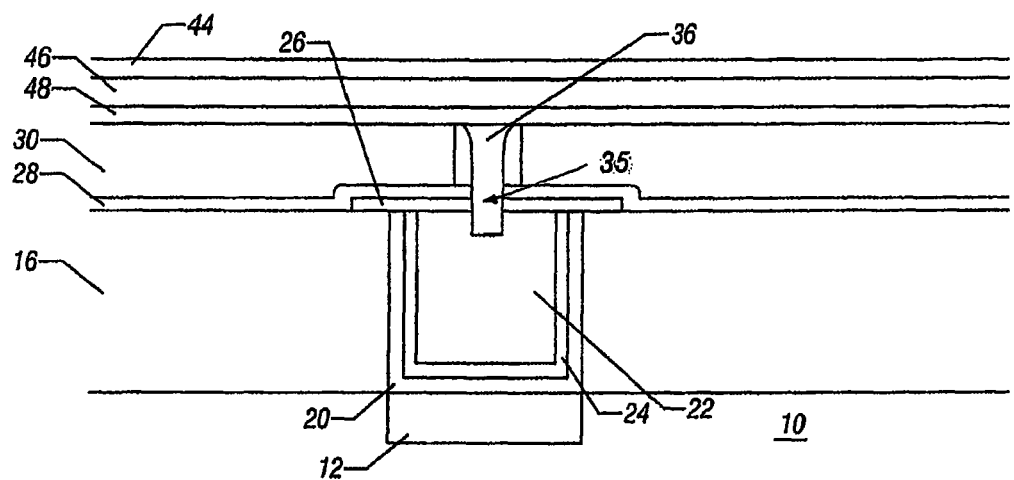
Figure 11:
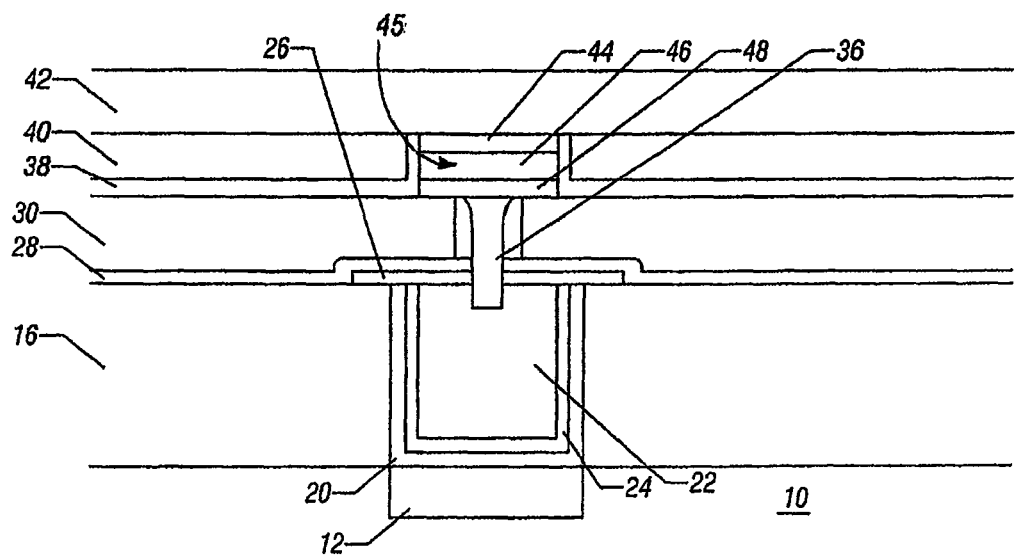
Figure 12:
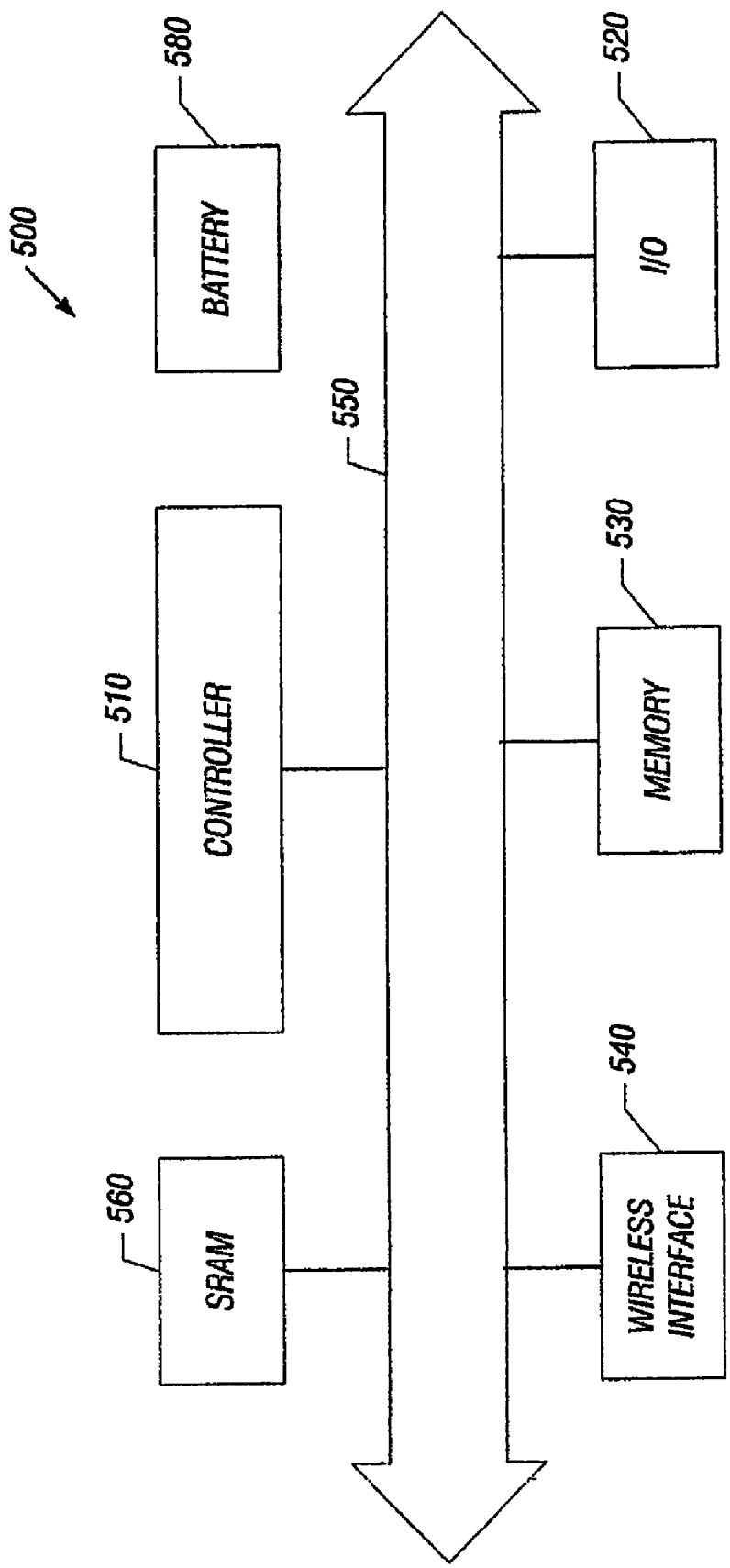

For the understanding of the present invention, a preferred embodiment is now described, purely as a non-limitative example, with reference to the enclosed drawings, wherein:

FIGS. 1-11 are enlarged, cross-sectional views at subsequent manufacture stages of a phase change memory, in accordance with one embodiment of the present invention; and FIG. 12 is a depiction of a schematic system incorporating the memory of FIG. 1.

DETAILED DESCRIPTION OF THE INVENTION

FIGS. 1-11 show cross-sections of a semiconductor wafer at subsequent manufacture stages of a multilevel phase change memory. In particular, the memory is capable of being programmed to more than the two conventional states, termed set and reset.

To obtain a sufficiently gradual slope, the chalcogenide structure is heated using a surrounding ring-shaped heater. Therefore, the heater only converts a ring-shaped region within the intervening chalcogenide. As a result, more gradual programming can be achieved.

Hereinafter, the ring-shaped region of the chalcogenide will be also termed "cylindrical solid". As used herein, the terms "ring-shaped" and "cylindrical solid" are not intended to be limited to circular structures, but to also include any three-dimensional structures definable by a straight line intersecting and moving along a closed plane curve. It is not necessary that the height or vertical dimension of such cylindrical solids be greater than the width or horizontal dimension.

Referring to FIG. 1, the fabrication of a phase change memory cell begins by forming a lower address line 12 within an interlayer dielectric 10. The interlayer dielectric 10 may be situated over a semiconductor substrate (not shown). The lower address line 12 is here a row line and may be made by conventional fabrication techniques in which a copper metallization is formed within the interlayer dielectric 10.

The interlayer dielectric 10 and address line 12 are covered by a first insulating layer 14, e.g., of silicon nitride and the first insulating layer 14 is covered by a second insulating layer 16 of, e.g., silicon dioxide.

Figure 2:
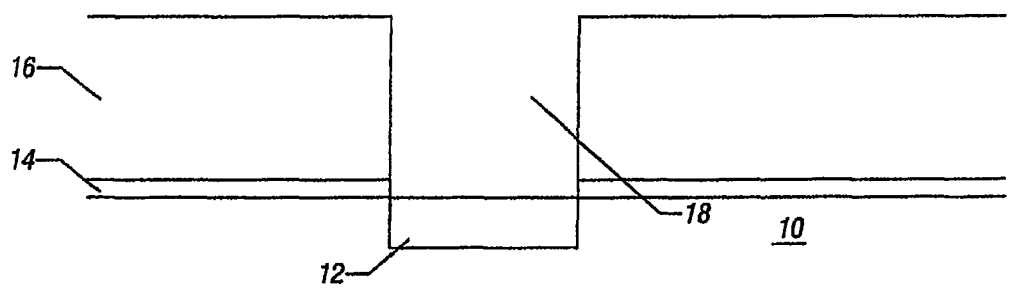
Figure 3:
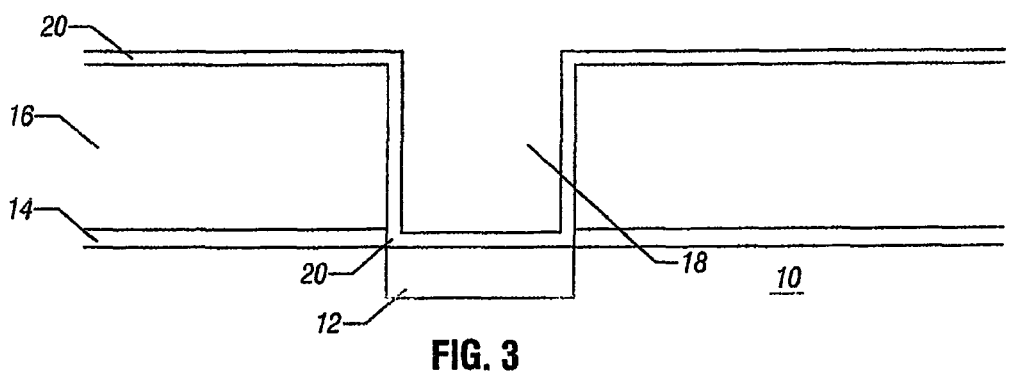

A trench or pore 18 is then formed through the insulating layers 16 and 14, down to the address line 12, as shown in FIG. 2. Then, the pore 18 is partially coated with a metallic layer 20 as shown in FIG. 3. The metallic layer 20 covers the second insulating layer 16 and the address line 12 at the bottom of the pore 18, as well. The metallic layer 20 forms a conductive line and is, e.g., formed of a conductive metal such as tungsten.

Figure 4:
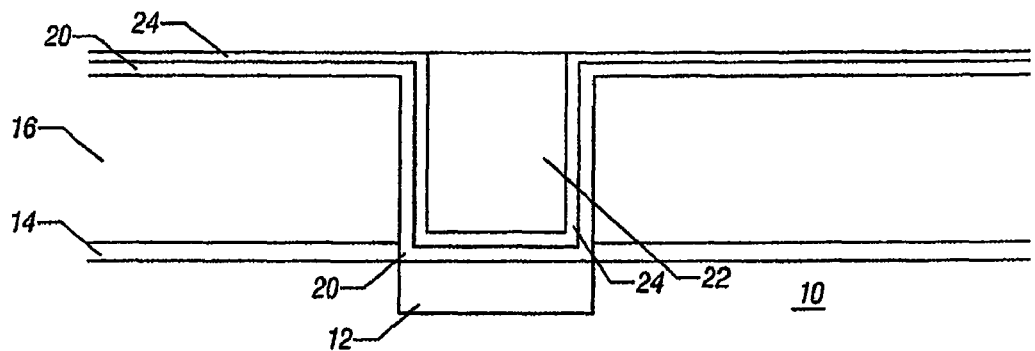

As shown in FIG. 4, a third insulating layer 24 is formed over the metallic layer 20. The third insulating layer 24, e.g., of nitride, prevents oxidation of the metallic layer 20. A filler 22, of insulating material, is deposited in the remaining pore 18. The filler 22 may be an oxide, in which case the third insulating layer 24 is advantageous to prevent oxidation of the metallic layer 20 during oxide formation.

Figure 5:
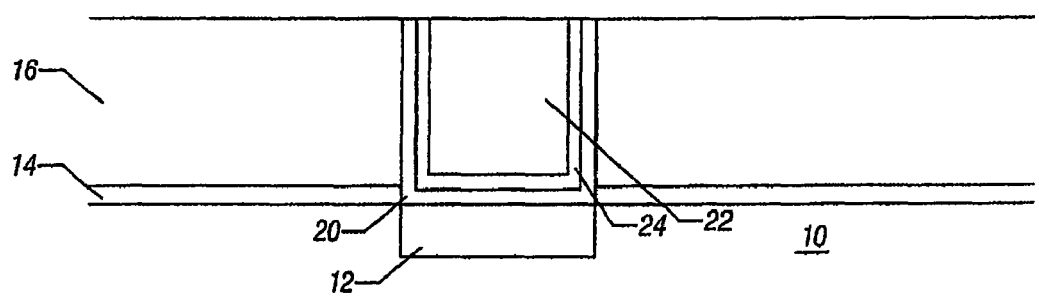

The structure then is planarized to remove the upper horizontal portions of the metallic layer 20, the insulating layer 24, and part of the filler 22, forming the structure shown in FIG. 5. E.g., a chemical mechanical planarization (CMP) may be used and stopped on the second insulating layer 16.

Figure 6:
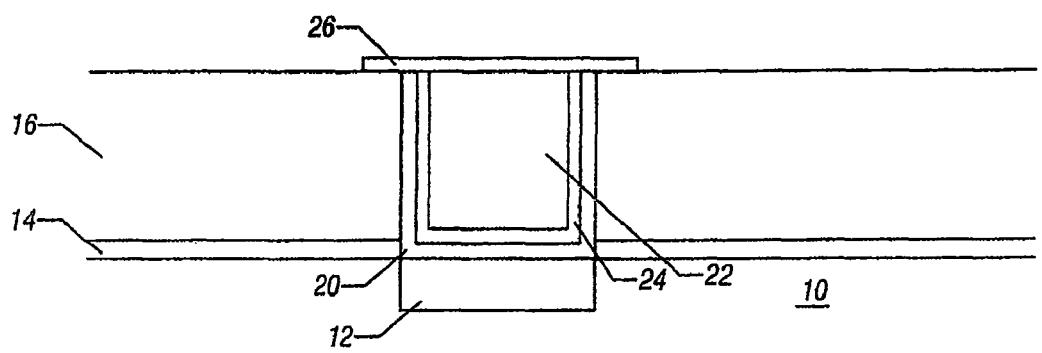

Then, a heater 26 of a high resistivity metallic material is deposited and patterned as shown in FIG. 6. An anneal treatment is performed to stabilize the heater 26 and to make the resulting heater 26 insensitive to so-called "first fire", that is the effects of the first electrical pulses. The heater 26 is, e.g., formed of titanium silicon nitride which may be sputter deposited. The heater may be patterned in a dot pattern which essentially is a small square or rectangle.

Figure 7:
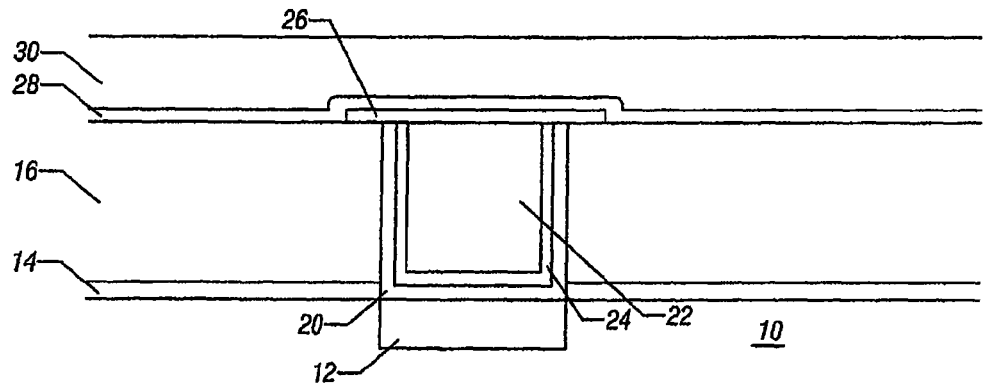

Then, a fourth insulating layer 28, such as nitride, is deposited as a buffer before a fifth insulating layer 30, e.g., of oxide, as shown in FIG. 7. The layer 30 may be deposited as well. Again, the fourth insulating layer 28 advantageously prevents oxidation of the heater 26 during the formation of the fifth insulating layer 30 while also serving as a nitride etch stop layer.

Figure 8:
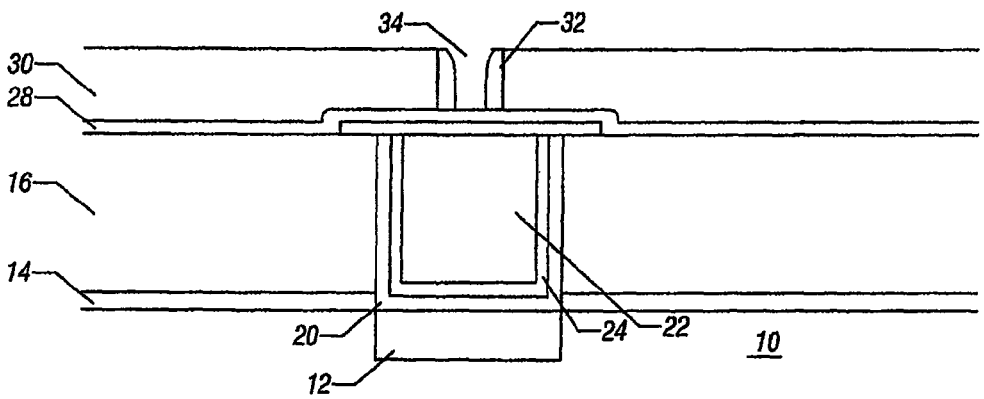

As shown in FIG. 8, a memory pore 34 is formed through the layer 30 down to the fourth insulating layer 28. A sidewall spacer 32 is formed therein. For example, the sidewall spacer 32 is formed of deposited nitride material which is subjected to an anisotropic etch. As a result, the memory pore 34 is reduced to sub-lithographic horizontal dimension. As used herein, "sub-lithographic" means less than the size possible with lithographic techniques, generally about 180 nanometers.

Figure 9:
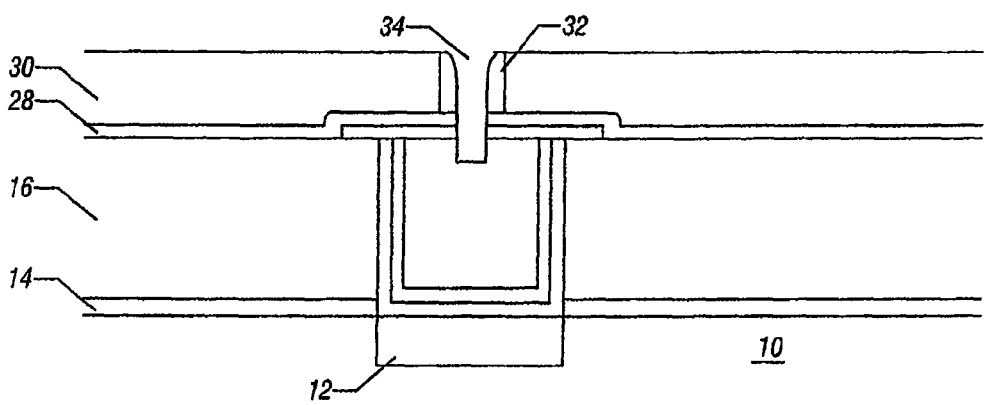

A metal etch is implemented to deepen the memory pore 34, as shown in FIG. 9. The etch proceeds through the fourth insulating layer 28 and the heater 26 and into the filler 22.

Then, as shown in FIG. 10, a memory material, e.g., a chalcogenide material 36, such as GST (e.g., $Ge_2Sb_2Te_5$) is deposited and planarized, to form a cylindrical solid. A closed peripheral edge of the heater 26 contacts a cylindrical edge portion of the chalcogenide material 36. Thus, the memory cell has a planar heater 26 which extends transversely to the chalcogenide material 36 and the heater 26 and chalcogenide material 36 intersect along a circular ring of contact. As a result of the peripheral contact, a ring-shaped region of the chalcogenide material 36, defining a memory element 35, can be converted between set, reset, and intermediate phases in a multilevel memory.

Next, a first conductive layer 48, a chalcogenide layer 46, and a second conductive layer 44 are successively deposited, patterned and etched to form an island or dot structure defining an access or select device 45. The access device 45, shown in FIG. 11, is here a so-called ovonic threshold switch (OTS). In the access device 45, the chalcogenide layer 46 is permanently in an amorphous phase and the access device 45 does not change phase. However, other access devices, including a chalcogenide containing a non-ovonic threshold switch, a plurality of ovonic threshold switches, a diode, an MOS transistor, or a bipolar transistor may be utilized as the access device 45.

Thereafter, an encapsulation layer 38 is deposited to protect the sidewalls of the chalcogenide material 46. The encapsulation layer 38 is, for example, a nitride layer. Then, a sixth insulating layer 40, such as oxide, is deposited. The structure is planarized and then an upper address line 42 is deposited, patterned, and etched, see FIG. 11. The upper address line 42 corresponds to a column line in a memory array.

Thus, an edge ring memory device is arranged vertically so that a small and compact cell can be fabricated. The edge ring memory device provides a small contact area to the phase change material 36, thereby providing a multilevel programming capability based on a gradual change in resistance versus programming current. The bulk of the heater 26 may be annealed to make the heater insensitive to the first fire effects.

The access device 45 is used to access memory element 35 during programming or reading of the memory element 35. The access device 45 is an ovonic threshold switch (OTS) made of a chalcogenide alloy that does not exhibit an amorphous to crystalline phase change and that undergoes rapid, electric field-initiated change in electrical conductivity that persists only so long as a holding voltage is present. An OTS may operate as a switch that is either "off" or "on" depending on the amount of voltage potential applied across the memory cell (comprising the access device 45 and the memory element 35), and more particularly on whether the current through the access device 45 exceeds the threshold current or voltage thereof, which then triggers the access device 45 into the on state. The off state is a substantially electrically nonconductive state and the on state is a substantially conductive state, with less resistance than the off state. In the on state, the voltage across the OTS is equal to its holding voltage VH plus I×Ron, where I is the current flowing through the OTS and Ron is the dynamic resistance from VH. For example, the OTS has a threshold voltage and, if a voltage potential less than the threshold voltage of the OTS is applied across the OTS, then the OTS remains "off" or in a relatively high resistive state so that little or no electrical current passes through the memory cell and most of the voltage drop from the selected row to the selected column is across the OTS.

Alternatively, if a voltage potential greater than the threshold voltage of the OTS is applied across OTS, then the OTS "turns on," i.e., operates in a relatively low resistive state so that electrical current passes through the memory cell. In other words, the OTS is in a substantially electrically non-conductive state if less than a predetermined voltage potential, e.g., the threshold voltage, is applied across the OTS. The OTS is in a substantially conductive state if greater than the predetermined voltage potential is applied across the OTS.

In the described embodiment, the chalcogenide layer 46 comprises a switching material in a substantially amorphous state positioned between conductive layers 44, 48 defining two electrodes so as to be repeatedly and reversibly switched between a higher resistance "off" state (e.g., greater than about ten megaOhms) and a relatively lower resistance "on" state (e.g., about one thousand Ohms in series with its holding voltage) by application of a predetermined electrical current or voltage potential. In this embodiment, the OTS is a two terminal device that has a current-voltage (I-V) characteristic similar to a phase change memory element that is in the amorphous state. However, unlike a phase change memory element, the chalcogenide layer 46 may not change phase. That is, the switching material of the OTS is not a programmable material, and, as a result, the OTS is not a memory device capable of storing information. For example, the switching material of the OTS remains permanently amorphous and the I-V characteristic remains the same throughout the operating life.

The chalcogenide layer 46 may include an alloy of arsenic (As), tellurium (Te), sulfur (S), germanium (Ge), selenium (Se), and antimony (Sb) with respective atomic percentages of 10%, 21%, 2%, 15%, 50%, and 2%. Although the scope of the present invention is not limited in this respect, in other embodiments, chalcogenide layer 24 may include Si, Te, As, Ge, sulfur (S), and selenium (Se). As another example, the composition of the chalcogenide layer 24 may comprise a Si concentration of about 5%, a Te concentration of about 34%, an As concentration of about 28%, a Ge concentration of about 11%, a S concentration of about 21%, and a Se concentration of about 1%.

In the low voltage or low electric field mode, i.e., where the voltage applied across the OTS is less than a threshold voltage, the OTS is "off" or non-conducting, and exhibits a relatively high resistance, e.g., greater than about 10 megaOhms. The OTS remains in the off state until a sufficient voltage VTH or a sufficient current ITH is applied, that switches the OTS to a conductive, relatively low-resistance on-state. After a voltage potential greater than about VTH is applied across the OTS, the voltage potential across the OTS drops ("snapback") to a holding voltage potential (VH). Snapback refers to the voltage difference between VTH and VH of a select device.

In the on state, the voltage potential across the OTS remains close to the holding voltage as current passing through the OTS is increased. The OTS remains on until the current through the OTS drops below a holding current. Below this value, the OTS turns off and returns to a relatively high-resistance, nonconductive off-state until the VTH and ITH are exceeded again.

Programming of chalcogenide material 36 to alter the state or phase of the material may be accomplished by applying voltage potentials to conductive lines 12 and 42, thereby generating a voltage potential across the access device 45 and the memory element 35. When the voltage potential is greater than the threshold voltage of the access device 45 and memory element 35, then an electrical current flows through the chalcogenide material 36 in response to the applied voltage potentials, and results in heating the memory material (chalcogenide material 36).

This heating may alter the memory state or phase of the memory material. Altering the phase or state of memory material alters the electrical characteristic of memory material, e.g., the resistance of the material is altered by altering the phase of the memory material. Thus, memory material may also be referred to as a programmable resistive material.

In the "reset" state, the memory material is in an amorphous or semi-amorphous state and in the "set" state, memory material is in a crystalline or semi-crystalline state. The resistance of memory material in the amorphous or semi-amorphous state is greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature crystallizes memory material and "sets" memory material (e.g., program memory material to a logic "1" value). Various resistances of memory material may be achieved to store information by varying the amount of current flow and duration through the volume of memory material.

In multi-level cell (MLC) operation, a phase change material is used to exhibit multiple states to store multiple bits of data, wherein changing the state of a phase change material having more than two states is accomplished by changing the resistivity/conductivity of the phase change material. For purposes of illustration, the embodiments herein describe binary systems that store 2-bits per memory cell using four states. A (0,0) state is e.g., defined as a substantially amorphous (high resistivity) state; a (1,1) state is e.g., defined as a substantially crystalline (low resistivity); and a (0,1) state and a (1,0) state are intermediate states between the substantially amorphous and substantially crystalline states. These intermediate states may be referred to as heterogeneous states. In addition, the substantially amorphous state may also be referred to as a relatively amorphous state or a generally amorphous state and the substantially crystalline state may be referred to as a relatively crystalline state or a generally crystalline state. In the four state example, the four states of the phase change material may be defined to have the following resistive relationship: the resistance of the phase change material in state (0,0) is greater than the resistance of the phase change material in state (0,1); the resistance of the phase change material in state (0,1) is greater than the resistance of the phase change material in state (1,0); and resistance of the phase change material in state (1,0) is greater than the resistance of the phase change material in state (1,1).

Although a binary 2-bit per cell system is described for purposes of illustration, the invention is not limited in this respect.

Programming is carried out by supplying the cell to be programmed with a programming signal that is shaped by setting the fall time so that the decaying or sloping trailing portion of the programming signal cools the phase change memory material at a rate sufficient to place the memory cell in a desired state. For example, the fall time of the programming signal applied to a phase change material is increased to reduce the resistance of the phase change material, and conversely, the fall time of the programming signal is decreased to increase the resistance of the phase change material.

In some embodiments, an amplitude of a programming signal is set to an amplitude sufficient to heat the phase change material of a memory cell to an amorphizing temperature and place the phase change material in a substantially amorphous state. To keep the phase change material in the substantially amorphous state, the material is rapidly cooled. This is accomplished by having a relatively fast fall time for the applied programming signal.

Alternatively, to place the phase change material in a polycrystalline state so that the phase change material has a relatively low resistance, the amplitude of the programming signal is set to an amplitude sufficient to heat the phase change material to an amorphizing temperature, and set a fall time of the programming signal so that after the memory material reaches the amorphizing temperature, the phase change memory material cools down at a sufficient rate so that the memory material is placed in the polycrystalline state.

As may be appreciated from the preceding discussion, application of signals having different amplitudes, durations and fall times heats and cools the phase change materials of memory cells to set the resistance of the phase change materials, thereby setting the state of the associated memory cell. In other words, the duration and amplitude of programming are selected so as to set the resistance of a phase change material to a desired resistance. In addition, the fall time of a signal is controlled to set the resistance of a phase change material to a desired resistance.

Turning to FIG. 12, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that are adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), a memory 530, a static random access memory (SRAM) 560, and a wireless interface 540 coupled to each other via a bus 545. The system 500 is powered by the battery 580. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 530 comprises the phase change memory having a memory array formed by the phase change cells discussed herein.

I/O device 520 may be used by a user to generate a message. System 500 uses wireless interface 540 to transmit and receive messages to and from a wireless communication network with a radio frequency (RF) signal. Examples of wireless interface 540 include an antenna or a wireless transceiver.

Finally, it is clear that numerous variations and modifications may be made to the phase change memory and process described and illustrated herein, all falling within the scope of the invention as defined in the attached claims.

The invention claimed is:

1. A method, comprising: manufacturing a phase change memory device, the manufacturing including:
    forming a heater;
    forming a sub-lithographic pore extending through the heater, the sub-lithographic pore being defined by an inner wall of the heater; and
    forming a phase change region extending completely through said pore and having an outer wall that contacts the inner wall of the heater, wherein the inner wall of the heater is configured to supply heat to the phase change region;
    forming an electrode in a first dielectric layer, forming a second dielectric layer over the first dielectric layer, and forming said heater over the second dielectric layer, said electrode, and said first dielectric layer;
    including forming a third dielectric layer over said heater and forming a sub-lithographic aperture through the third dielectric layer; and
    wherein forming said sub-lithographic aperture comprises forming a lithographic aperture and reducing a width of said lithographic aperture using sidewall spacers.

2. The method of claim 1 wherein forming the phase change region includes completely extending the phase change region through the heater, the phase change region extending past two opposite sides of said heater.

3. The method of claim 1, including forming a cup-shaped conductor coupling said heater to said electrode.

4. The method of claim 3, including filling said cup-shaped conductor with a third dielectric layer.

5. The method of claim 1, including forming the sub-lithographic pore by etching said heater through said sub-lithographic aperture and etching past the heater by a distance.

6. The method of claim 1, including forming an ovonic threshold switch over said phase change region.

7. The method of claim 1, wherein the phase change region extends past a portion of the heater laterally contacting the phase change region.

8. The method of claim 1, wherein the inner wall of the heater encloses a cross-section of the phase change region and physically contacts a longitudinally extending portion of the outer wall of the phase change region.

9. The method of claim 1, wherein the heater longitudinally extends transversely to a longitudinal dimension of the phase change region.

10. A method, comprising:
    manufacturing a phase change memory device, the manufacturing including:
    forming a planar heater;
    forming an inner wall of the heater by etching a pore into the planar heater, the inner wall of the heater delimiting the pore;
    forming a phase change region in said pore, the phase change region having an outer wall that contacts the inner wall of the heater delimiting the pore;
    forming a first insulator layer on the heater;
    forming a second insulator layer on the first insulator layer;
    forming a lithographic aperture through said second insulator layer;
    forming a sub-lithographic aperture through the second insulator layer by forming at least one sidewall spacer in the lithographic aperture; and
    extending the sub-lithographic aperture through the first insulator layer by etching through the first insulator layer using the at least one sidewall spacer and the lithographic aperture as a mask, wherein the pore is etched through the sub-lithographic aperture in the first insulator layer.

11. The method of claim 10, wherein the pore extends completely through the planar heater.

12. The method of claim 10, further comprising:
    forming an insulator over the heater;
    forming a lithographic aperture through the insulator;
    forming a sub-lithographic aperture through the insulator by forming at least one sidewall spacer in the lithographic aperture, wherein etching the pore in the heater includes etching the pore in the heater using the at least one sidewall spacer and the lithographic aperture as a mask.

* * * * *